US010566935B2

(12) United States Patent
Maalouf et al.

(10) Patent No.: US 10,566,935 B2
(45) Date of Patent: Feb. 18, 2020

(54) MULTIPLE-PATH RF AMPLIFIERS WITH ANGULARLY OFFSET SIGNAL PATH DIRECTIONS, AND METHODS OF MANUFACTURE THEREOF

(71) Applicant: NXP USA, Inc., Austin, TX (US)

(72) Inventors: Elie A. Maalouf, Mesa, AZ (US); Margaret A. Szymanowski, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 220 days.

(21) Appl. No.: 15/710,585

(22) Filed: Sep. 20, 2017

(65) Prior Publication Data

US 2018/0013391 A1   Jan. 11, 2018

Related U.S. Application Data

(63) Continuation of application No. 15/157,025, filed on May 17, 2016, now Pat. No. 9,774,301.

(51) Int. Cl.
*H03F 1/02* (2006.01)
*H01L 23/498* (2006.01)
(Continued)

(52) U.S. Cl.
CPC ..... *H03F 1/0288* (2013.01); *H01L 23/49838* (2013.01); *H01L 23/66* (2013.01); *H01L 24/49* (2013.01); *H01L 25/0655* (2013.01); *H01L 25/50* (2013.01); *H03F 3/189* (2013.01); *H03F 3/193* (2013.01); *H03F 3/211* (2013.01); *H03F 3/213* (2013.01); *H03F 3/24* (2013.01);

(Continued)

(58) Field of Classification Search
CPC ..................................... H03F 1/0288
See application file for complete search history.

(56) References Cited

U.S. PATENT DOCUMENTS 10,250,197 B1 *  4/2019  Schultz ............... H03F 1/565
2012/0235737 A1 *  9/2012  Reisner .............. H03F 1/0222
                                                                330/127
(Continued)

OTHER PUBLICATIONS

Tsai, Shu-Hsiao; "Layout Practices for Die Size Reduction on InGaP/GaAs HBT MMICs for HandsetPower Amplifier Applications"; CS MANTECH Conference, New Orleans, LA, USA; 4 pages. (May 13-16, 2013).

*Primary Examiner* — Patricia T Nguyen
(74) *Attorney, Agent, or Firm* — Sherry W. Schumm

(57) ABSTRACT

An embodiment of a Doherty amplifier module includes a substrate, an RF signal splitter, a carrier amplifier die, and a peaking amplifier die. The RF signal splitter divides an input RF signal into first and second input RF signals, and conveys the first and second input RF signals to first and second splitter output terminals. The carrier amplifier die includes one or more first power transistors configured to amplify, along a carrier signal path, the first input RF signal to produce an amplified first RF signal. The peaking amplifier die includes one or more second power transistors configured to amplify, along a peaking signal path, the second input RF signal to produce an amplified second RF signal. The carrier and peaking amplifier die are coupled to the substrate so that the RF signal paths through the carrier and peaking amplifier die extend in substantially different (e.g., orthogonal) directions.

22 Claims, 3 Drawing Sheets

(51) Int. Cl.
*H01L 23/66* (2006.01)
*H01L 23/00* (2006.01)
*H01L 25/065* (2006.01)
*H01L 25/00* (2006.01)
*H03F 3/60* (2006.01)
*H03F 3/189* (2006.01)
*H03F 3/24* (2006.01)
*H03F 3/193* (2006.01)
*H03F 3/21* (2006.01)
*H03F 3/213* (2006.01)

(52) U.S. Cl.
CPC ............ *H03F 3/602* (2013.01); *H03F 3/604* (2013.01); *H01L 24/48* (2013.01); *H01L 2223/6627* (2013.01); *H01L 2223/6644* (2013.01); *H01L 2224/48091* (2013.01); *H01L 2224/48106* (2013.01); *H01L 2224/48227* (2013.01); *H01L 2224/49175* (2013.01); *H01L 2924/00014* (2013.01); *H01L 2924/1033* (2013.01); *H01L 2924/10253* (2013.01); *H01L 2924/10329* (2013.01); *H01L 2924/13064* (2013.01); *H01L 2924/13091* (2013.01); *H01L 2924/141* (2013.01); *H03F 2200/114* (2013.01); *H03F 2200/222* (2013.01); *H03F 2200/318* (2013.01); *H03F 2200/387* (2013.01); *H03F 2200/411* (2013.01); *H03F 2200/432* (2013.01); *H03F 2200/451* (2013.01); *H03F 2200/543* (2013.01); *H03F 2203/21139* (2013.01)

(56) References Cited

U.S. PATENT DOCUMENTS

| | | | |
|---|---|---|---|
| 2014/0145791 A1* | 5/2014 | Svechtarov | H03F 1/0288 330/295 |
| 2014/0354362 A1 | 12/2014 | Ahmed et al. | |
| 2015/0340306 A1* | 11/2015 | Komposch | H01L 23/49503 330/295 |
| 2016/0087586 A1 | 3/2016 | Szymanowski et al. | |
| 2016/0112012 A1* | 4/2016 | Blednov | H03F 1/0288 455/561 |
| 2016/0294340 A1* | 10/2016 | Goel | H01L 23/66 |
| 2017/0093446 A1* | 3/2017 | Poulin | H05K 1/181 |
| 2018/0254253 A1* | 9/2018 | Zhang | H01L 23/49503 |

* cited by examiner

MULTIPLE-PATH RF AMPLIFIERS WITH ANGULARLY OFFSET SIGNAL PATH DIRECTIONS, AND METHODS OF MANUFACTURE THEREOF

RELATED APPLICATION

This application is a continuation of co-pending, U.S. patent application Ser. No. 15/157,025, filed on May 17, 2016.

TECHNICAL FIELD

Embodiments of the subject matter described herein relate generally to multiple-path radio frequency (RF) amplifiers, and more particularly to Doherty amplifier devices and modules.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

The high efficiency of the Doherty architecture makes the architecture desirable for current and next-generation wireless systems. However, the architecture presents challenges in terms of semiconductor package design. Current Doherty amplifier semiconductor package designs call for the use of discrete devices, conductors, and integrated circuits to implement each amplification path. For example, the carrier and peaking amplification paths each may include a distinct power transistor IC die, along with distinct inductance and capacitance components. These distinct power transistor IC dies and components are maintained a distance apart in a typical device package in order to limit potential performance degradation that may occur due to signal coupling between the carrier and peaking amplifiers. More specifically, undesirable signal coupling between the carrier and peaking amplifiers may involve the transfer of energy between components of the carrier and peaking amplifier paths through magnetic and/or electric fields associated with the signals carried on those amplifier paths.

Unfortunately, the desire to maintain a significant spatial distance between amplifier paths in a device package in order to reduce coupling between the paths limits the potential for miniaturization of the semiconductor package. Limiting miniaturization is undesirable where low cost, a low weight, and a small volume and small PCB real estate are important package attributes for various applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In a multiple-path amplifier, coupling between signal paths can adversely affect amplifier performance. Coupling can be of two types, including electric coupling (commonly referred to as capacitive coupling) and magnetic coupling (commonly referred to as inductive coupling). Inductive and magnetic coupling occurs when a time-varying magnetic field exists between current carrying, parallel conductors that are in close proximity to one another. For example, one type of coupling in a Doherty amplifier power transistor package may occur between arrays of signal wires (e.g., wirebond arrays), which are connected between the various electrical components making up each of the carrier and peaking amplifier paths. The performance of a Doherty amplifier can be adversely affected by coupling between adjacent wirebond arrays. Accordingly, coupling issues have restricted miniaturization efforts for Doherty amplifiers due to minimum spacing requirements between the carrier and peaking amplifier paths.

Embodiments of the inventive subject matter include multiple-path amplifiers, including but not limited to Doherty amplifiers, with angularly offset signal paths (e.g., orthogonal signal paths). In one embodiment, an IC power transistor die for one of the signal paths (e.g., a carrier path of a Doherty amplifier) and a separate IC power transistor die for another of the signal paths (e.g., a peaking path of a Doherty amplifier) are arranged in a device package or module in an angularly offset (e.g., orthogonal) manner. This results in an angular offset between the signal paths. By orienting the signal paths in non-parallel orientations, coupling between the signal paths may be reduced significantly.

In a Doherty amplifier, an input signal is split at an input or power splitter between the carrier and peaking amplification paths. The split signals are then separately amplified by the carrier and peaking amplifiers of the Doherty amplifier and combined at an output stage. When combining the outputs of the carrier and peaking amplifiers, it may be desired to make minor adjustments in the phase and amplitude or attenuation of the Doherty device's input splitter to provide optimal balancing between the outputs of each path. To facilitate this adjustment, a Doherty amplifier may include an adjustable power divider or splitter that can be used to fine-tune the configuration of the input signals to both the carrier and peaking amplifiers. A Doherty amplifier may also include an adjustable phase delay and/or an amplitude adjustment configured to selectively modify the phase shift and/or amplitude one of one or more paths of the Doherty amplifier.

Figure 1:
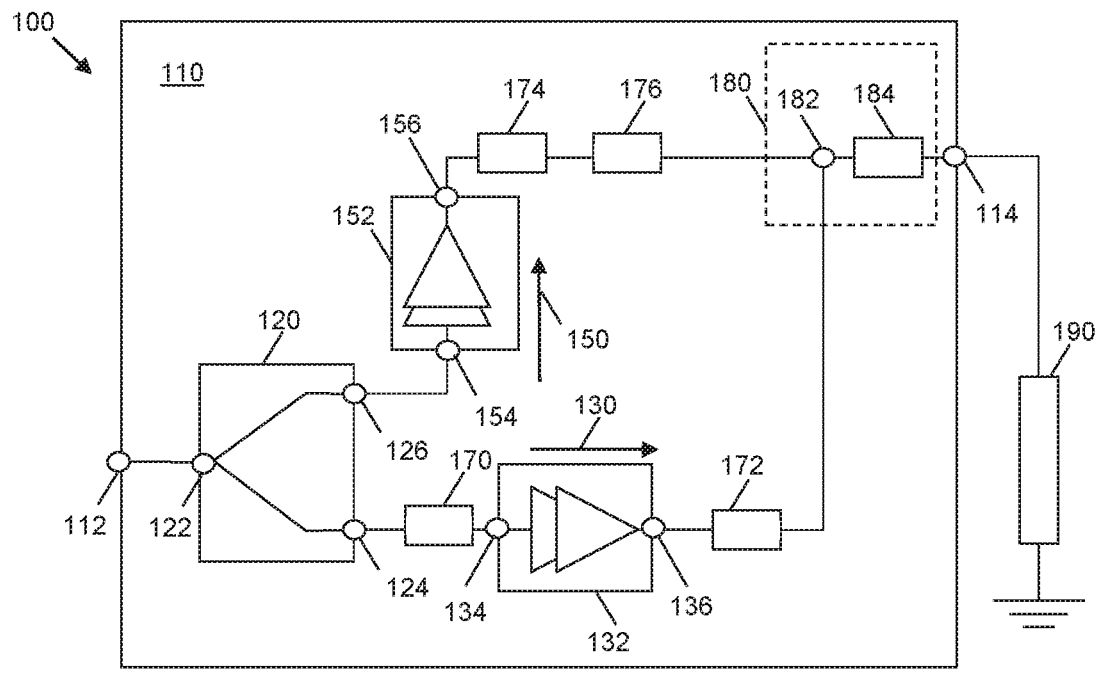
FIG. 1 is a schematic diagram of a Doherty amplifier, in accordance with an example embodiment.

FIG. 1 is a schematic diagram of a Doherty amplifier 100, in accordance with an example embodiment. As indicated in FIG. 1 with box 110, some or all components of Doherty amplifier 100 may be implemented in a single device package or module. As will be explained in detail later, and in accordance with various embodiments, the orientations of the various amplifier components enable the size of the package or module to be significantly reduced, when compared with conventional packaging techniques, while still meeting gain, linearity, stability, and efficiency performance criteria. This is achieved, more specifically, by orienting the various amplifier components to establish an angular offset between portions of the carrier and peaking amplifier signal paths (e.g., paths 130, 150). The established angular offset has the effect of reducing coupling between the carrier and peaking paths.

Doherty amplifier 100 includes an RF input node 112, an RF output node 114, a power splitter 120, a carrier amplifier path 130, a peaking amplifier path 150, and a combiner 180, in an embodiment. When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals, which are provided to the carrier and peaking amplifier paths 130, 150 through outputs 124, 126. According to an embodiment, the power splitter 120 includes a first phase shift element, which is configured to impart a first phase shift (e.g., about a 90 degree phase shift) to the first RF signal before it is provided to output 124. Accordingly, at outputs 124 and 126, the first and second RF signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the first and second RF signals based on externally-provided control signals.

Figure 2:
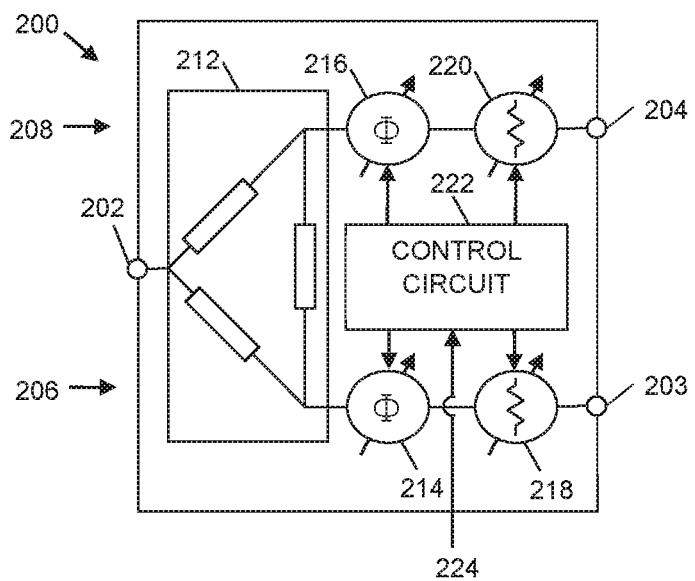
FIG. 2 is a schematic diagram of an RF signal power splitter, in accordance with an example embodiment.

For example, FIG. 2 is a schematic diagram of an RF signal power splitter 200 that may be used as the power splitter 120 in the Doherty amplifier 100 of FIG. 1, in accordance with an example embodiment. The RF power splitter 200 may include, for example, a splitter input terminal 202 (e.g., input 122, FIG. 1), two splitter output terminals 203, 204 (e.g., output terminals 124, 126, FIG. 1), a power divider 212, first and second phase shifters 214, 216, first and second attenuators 218, 220, and a control circuit 222. More specifically, the RF signal power splitter 200 may include a first phase shifter 214 and a first variable attenuator 218 along a first signal path 206, and a second phase shifter 216 and a second variable attenuator 220 along a second signal path 208. Although the phase shifters 214, 216 are shown to precede the variable attenuators 218, 220 along paths 206, 208, the phase shifters 214, 216 and attenuators 218, 220 may be reversed in order, in an alternate embodiment. Further, any one or more of the phase shifters 214, 216 and/or attenuators 218, 220 may be non-variable, or may be excluded from the power splitter 200, in various embodiments.

The power divider 212 is configured to split the power of an input RF signal received at terminal 202, and to provide the resulting RF signals to first and second power divider outputs that are coupled to the two paths 206, 208. In various embodiments, the power divider 212 may divide the input power equally or non-equally between the paths 206, 208. In addition, according to an embodiment, the power divider 212 may apply the aforementioned first phase shift (e.g., of about 90 degrees) to the portion of the RF signal that is supplied to path 206.

According to an embodiment, and during operation, external circuitry may send signals to the control circuit 222 through an interface 224, where the signals indicate desired phase shifts and attenuation levels that the RF signal power splitter 200 should apply to RF signals carried along paths 206, 208. In response to receiving signals indicating desired phase shifts, the control circuit 222 provides control signals to the first and second phase shifters 214, 216. In response, the first and second phase shifters 214, 216 apply corresponding phase shifts to the signals conveyed along the first and second paths 206, 208. It should be noted that the phase shift that may be applied by phase shifter 214 along path 206 would be in addition to the approximately 90 degree phase shift applied to the first RF signal by the power divider 212. In addition, in response to receiving signals indicating desired attenuation levels, the control circuit 222 provides control signals to the first and second variable attenuators 218, 220. In response, the first and second variable attenuators 218, 220 attenuate the signals conveyed along the first and second paths 206, 208. Ultimately, the phase shifted and/or attenuated RF signals are produced at output terminals 203, 204 (e.g., outputs 124, 126, FIG. 1). Although a phase difference is more than likely to exist between the RF signals produced at output terminals 203, 204, it should be noted that the RF signals have the same frequency as each other since the RF signals produced at output terminals 203, 204 are derived from the same RF input signal.

Referring again to FIG. 1, the outputs 124, 126 of the power splitter 120 are connected to the carrier and peaking amplifier paths 130, 150, respectively. The carrier amplifier path 130 is configured to amplify the first RF signal from the power splitter 120, and to provide the amplified first RF signal to a summing node 182 of the power combiner 180. Similarly, the peaking amplifier path 150 is configured to amplify the second RF signal from the power splitter 120, and to provide the amplified second RF signal to the summing node 182 of the power combiner 180, where the paths 130, 150 are designed so that the amplified first and second RF signals arrive in phase with each other at the summing node 182.

According to an embodiment, the carrier amplifier path 130 includes an impedance transformation element 170, a carrier amplifier die 132, and a second phase shift element 172. In addition, the carrier amplifier path 130 may include various components associated with an output impedance matching network (not illustrated), where the output impedance matching network and the phase shift element 172 may share some components.

According to an embodiment, the second phase shift element 172 includes an impedance inverter or a lambda/4 (λ/4) transmission line phase shift element, which imparts about a 90 degree relative phase shift to the first RF signal. Accordingly, the combination of the first phase shift element within power splitter 120 (and/or power divider 212) and the second phase shift element 172 imparts about a 180 degree relative phase shift to the first RF signal along the carrier amplifier path 130.

The carrier amplifier die 132 includes an RF input terminal 134, an RF output terminal 136, and one or more amplification stages coupled between the input and output terminals 134, 136, in various embodiments. The RF input terminal 134 is coupled through the first impedance matching element 170 to the first output 124 of the power splitter 120, and thus the RF input terminal 134 receives a phase-shifted version of the first RF signal that was produced by the power splitter 120 (e.g., a 90 degree phase shifted version of the first RF signal).

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal or the source terminal) is electrically connected to the RF output terminal 136, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low power, and a second transistor functions as an output amplifier transistor that has a relatively high power. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 136, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 136 of the carrier amplifier die 132 is coupled to the summing node 182 of the power combiner 180 through a second phase shift element 172, in an embodiment. As mentioned above, the second phase shift element 172 includes an impedance inverter or a lambda/4 (λ/4) transmission line phase shift element, which imparts about a 90 degree relative phase shift to the amplified first RF signal that is produced at the RF output terminal 136.

Reference is now made to the peaking amplifier path 150, which includes a peaking amplifier die 152, a third phase shift element 174, and a fourth phase shift element 176, in an embodiment. In addition, the peaking amplifier path 150 may include various components associated with input and output impedance matching networks (not illustrated), where the impedance matching networks and the phase shift elements 174, 176 may share some components.

The peaking amplifier die 152 includes an RF input terminal 154, an RF output terminal 156, and one or more amplification stages coupled between the input and output terminals 154, 156, in various embodiments. The RF input terminal 154 is coupled to the second output 126 of the power splitter 120, and thus the RF input terminal 154 receives the second RF signal that was produced by the power splitter 120.

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 156 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 156 of the peaking amplifier die 152 is coupled to the summing node 182 of the power combiner 180 through the third and fourth phase shift elements 174, 176, in an embodiment. According to an embodiment, each of the third and fourth phase shift elements 174, 176 includes an impedance inverter or a lambda/4 (λ/4) transmission line phase shift element, which imparts about a 90 degree relative phase shift to the second RF signal. Accordingly, the combination of the third and fourth phase shift elements 174, 176 imparts about a 180 degree relative phase shift to the second RF signal along the peaking amplifier path 150.

The amplified first and second RF signals combine in phase at the summing node 182 of the combiner 180. In addition, an output impedance matching network 184 functions to present the proper load impedances to each of carrier and peaking amplifier dies 132, 152. The resulting amplified RF output signal is produced at RF output node 114, to which an output load 190 (e.g., an antenna) is connected.

Amplifier 100 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier die 132, such that the carrier amplifier die 132 operates in a class AB mode, and biasing the peaking amplifier die 152 such that the peaking amplifier die 152 operates in a class C mode.

In the embodiment illustrated in FIG. 1 and described above, the first phase shift element in splitter 120 and the second phase shift element 172 impart about 180 degrees of phase shift to the first RF signal, and the third and fourth phase shift elements 174, 176 similarly impart about 180 degrees of phase shift to the second RF signal so that the first and second signals may combine in phase at the summing node 182. More specifically, a first phase shift (e.g., 90 degrees) is applied to the first RF signal prior to amplification of that signal by the carrier amplifier die 132, and no such phase shift is applied to the second RF signal prior to amplification of that signal by the peaking amplifier die 152. However, the first phase shift applied to the first RF signal prior to amplification is compensated for by an additional phase shift element (e.g., element 174) at the output of the peaking amplifier die 152. In an alternate embodiment, a first phase shift (e.g., 90 degrees) may be applied to the second RF signal prior to amplification of that signal by the peaking amplifier die 152, where no such phase shift is applied to the first RF signal prior to amplification of that signal by the carrier amplifier die 132. In such an embodiment, the first phase shift applied to the second RF signal prior to amplification may be compensated for by an additional phase shift element at the output of the carrier amplifier die 132. In still other alternate embodiments, other combinations of phase shift elements may be implemented in the carrier and/or peaking paths 130, 150 prior to amplification to achieve about 90 degrees of phase difference between the first and second RF signals prior to amplification, and the phase shifts applied to the amplified first and second RF signals may be selected accordingly to ensure that the signals combine in phase at summing node 182.

According to an embodiment, the physical components of the carrier and peaking amplification paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 136. Similarly, a portion of a second signal path through the peaking amplifier die 152 extends in a second direction (indicated by arrow 150) between the RF input and output terminals 154, 156, where the first and second directions are substantially different from each other. In the illustrated embodiment, the first and second directions are orthogonal to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

According to an embodiment, the angular separation between directions of the portions of the first and second signal paths that traverse the carrier and peaking amplifier die 132, 152 is achieved by orienting the carrier and peaking amplifier die 132, 152 so that the signal paths between their respective RF input and output terminals 134, 136, 154, 156 are angularly separated. For example, the carrier and peaking amplifier die 132, 152 are oriented orthogonally, in an embodiment, so that the directions of the portions of the signal paths through the carrier and peaking amplifier die 132, 152 also are orthogonal.

During operation, the angular separation of the signal paths through the carrier and peaking amplifier die 132, 152 reduces the amount of coupling between those portions of the signal paths, when compared with a system in which the carrier and peaking die and/or carrier and peaking signal paths run parallel with each other. Given this reduction in coupling between the signal paths, the carrier and peaking amplifier die 132, 152 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

Figure 3:
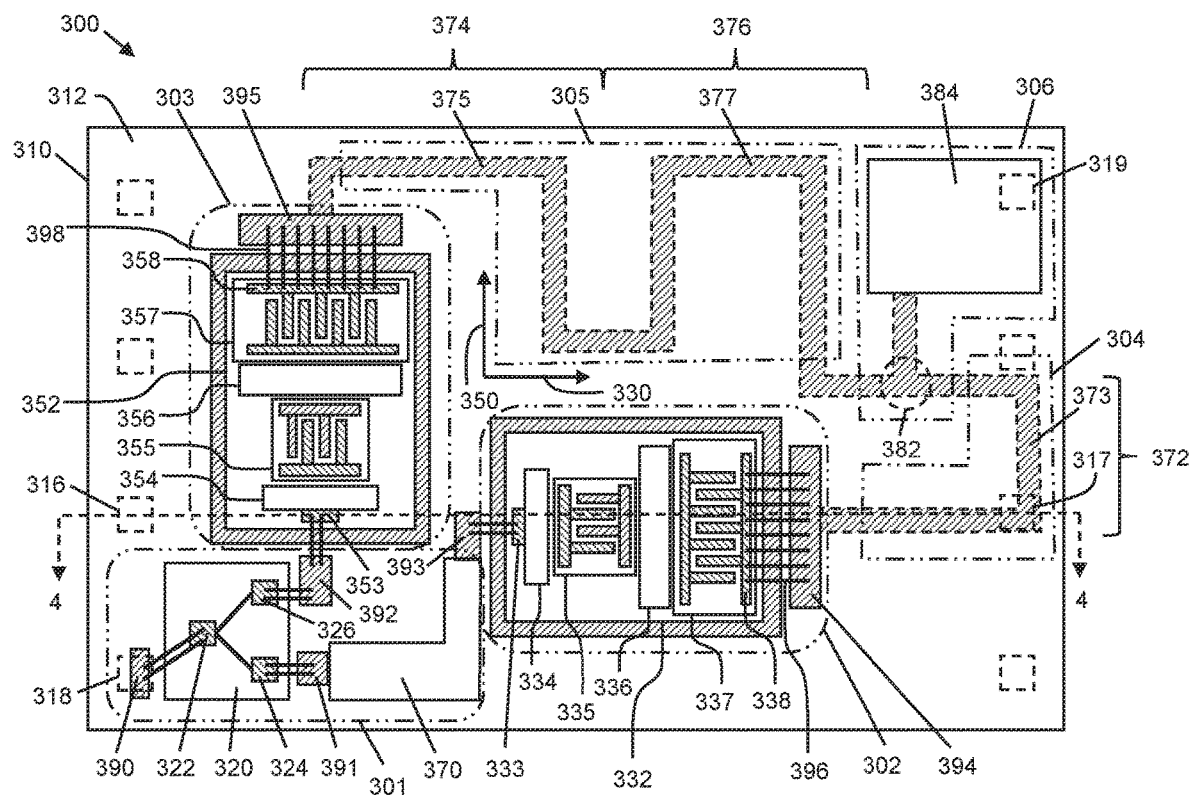
FIG. 3 is a top view of a Doherty amplifier module, in accordance with an example embodiment.

An embodiment of a physical implementation of the Doherty amplifier circuit of FIG. 1 now will be described in detail in conjunction with FIGS. 3 and 4. More specifically, FIG. 3 is a top view of a Doherty amplifier module 300, in accordance with an example embodiment. FIG. 3 should be viewed simultaneously with FIG. 4, which is a cross-sectional, side view of the module 300 of FIG. 3 along line 4-4. Doherty amplifier module 300 includes a substrate 310, a power splitter 320 (e.g., power splitter 120, 200, FIGS. 1, 2), a carrier amplifier die 332 (e.g., carrier amplifier die 132, FIG. 1), a peaking amplifier die 352 (e.g., peaking amplifier die 152, FIG. 1), various phase shift and impedance matching elements, and a combiner.

According to an embodiment, the Doherty amplifier module 300 is implemented as a land grid array (LGA) module. Accordingly, the substrate 310 has a component mounting surface 312 and a land surface 314. According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 6 mm.

For example, the substrate 300 may be a multi-layer organic substrate with a plurality of metal layers 410, 411, 412, 413, 414, which are separated by dielectric material. According to an embodiment, the bottom metal layer 410 is utilized to provide externally-accessible, conductive landing pads 316, 317, 318, 319 of the LGA, where the locations of some example landing pads 316-319 are indicated with dashed boxes in FIG. 3. These landing pads 316-319 (among others, not illustrated) enable surface mounting of the Doherty amplifier module 300 onto a separate substrate (not illustrated) that provides electrical connectivity to other portions of an RF system. Although module 300 is depicted as an LGA module, module 300 alternatively may be packaged as a pin grid array module, a quad flat no leads (QFN) module, or another type of package.

One or more other metal layers (e.g., layers 411, 412) of the substrate 310 may be used to convey DC voltages (e.g., DC bias voltages) and to provide a ground reference. Finally, still other layers (e.g., layers 413, 414) may be used to convey RF and other signals through the module 300. Additionally, a patterned metal layer 415 may be formed on the mounting surface 312 of the substrate 310. As will be discussed in more detail below, the patterned metal layer 415 may include a plurality of conductive contacts 390-395 on the mounting surface 312, which facilitates electrical connection to die and other components that may be mounted to the mounting surface 312. Conductive vias (e.g., vias 420, 421, 422) provide for electrical connectivity between the metal layers 410-415.

Each of the carrier and peaking amplifier die 332, 352 may produce significant amounts of heat during operation. In addition, each of the carrier and peaking amplifier die 332, 352 also need access to a ground reference. Accordingly, in an embodiment, substrate 310 also includes a plurality of electrically and thermally conductive trenches 480, 482 to which the carrier and peaking amplifier die 332, 352 are coupled (e.g., with solder, brazing material, silver sinter, or other die attach materials). The trenches 480, 482 extend through the substrate thickness in first-die and second-die mounting zones 302, 303 to provide heat sinks and ground reference access to the carrier and peaking amplifier die 332, 352. For example, the conductive trenches 480, 482 may be filled with copper or another thermally and electrically conductive material. In alternate embodiments, the trenches 480, 482 may be replaced with conductive slugs (e.g., copper slugs) or with thermal vias.

Referring to the top view of module 300 in FIG. 3, a plurality of non-overlapping zones are defined at the mounting surface 312 of the substrate 310. More specifically, the non-overlapping zones include an input signal zone 301, a first-die mounting zone 302, a second-die mounting zone 303, a first-path output network zone 304, a second-path output network zone 305, and an output signal combiner zone 306. Within the input signal zone 301, a conductive landing pad 318 exposed at the land surface 314 is electrically coupled through the substrate 310 to a conductive contact 390 at the mounting surface 312. The landing pad 318 and contact 390, along with the electrical connections between them, function as the RF input node (e.g., RF input node 112, FIG. 1) for the module 300.

The power splitter 320 is coupled to the mounting surface 312 in the input signal zone 301. According to an embodiment, the power splitter 320 may include one or more discrete die and/or components, although it is represented in FIG. 3 as a single element. The power splitter includes an input terminal 322 (e.g., input 122, FIG. 1) and two output terminals 324, 326 (e.g., outputs 124, 126, FIG. 1). The input terminal 322 is electrically coupled (e.g., through wirebonds, as shown) to conductive contact 390 to receive an input RF signal. In addition, the output terminals 324, 326 are electrically coupled (e.g., through additional wirebonds, as shown) to conductive contacts 391, 392 at the mounting surface 312. The power splitter 320 is configured to split the power of the input RF signal received through input terminal 322 into first and second RF signals, which are produced at the output terminals 324, 326. In addition, the power splitter 320 may include a first phase shift element configured to impart about a 90 degree phase shift to the RF signal provided at output terminal 324. As discussed previously, the power splitter 320 may consist of fixed-value, passive components, or the power splitter 320 may include variable phase shifters and/or attenuators (e.g., as with the power splitter 200, FIG. 2).

The first and second RF signals may have equal or unequal power, as discussed previously. The first RF signal produced at output terminal 324 and conveyed to conductive contact 391 is amplified through a carrier amplifier path, which includes an impedance matching element 370 (e.g., impedance matching element 170, FIG. 1) mounted within the input signal zone 301, a carrier amplifier die 332 (e.g., die 132, FIG. 1) mounted within the first-die mounting zone 302, and a second phase shift element 372 (e.g., phase shift element 172, FIG. 1) within the first-path output network zone 304. Although the detail is not shown in FIG. 3, the impedance matching element 370 may include a plurality of discrete and/or integrated components (e.g., inductors and capacitors).

The illustrated embodiment of carrier amplifier die 332 embodies a two-stage amplifier, which includes an RF input terminal 333, an input matching network 334, a driver transistor 335, an interstage matching network 336, an output transistor 337, and an RF output terminal 338. The driver and output transistors 335, 337 are coupled in series, where the driver transistor 335 applies a relatively low gain to the first RF signal, and the output transistor 337 applies a relatively high gain to the first RF signal after preliminary amplification by the driver transistor 335. In other embodiments, the carrier amplifier die 332 may embody a single stage amplifier, or may include more than two amplification stages. The signal path through the carrier amplifier die 332 is in a direction extending from the RF input terminal 333 to the RF output terminal 338, which direction is indicated by arrow 330.

In any event, the amplified first RF signal is produced by the carrier amplifier die 332 at the RF output terminal 338. According to an embodiment, the RF output terminal 338 is electrically coupled to contact 394 at the mounting surface 312 with a wirebond array 396 (i.e., a plurality of parallel, closely spaced wirebonds). As illustrated in FIG. 3, the wirebonds of the wirebond array 396 are aligned in the same direction as the signal path through the carrier amplifier die 332 (i.e., in the direction indicated by arrow 330).

Through the wirebond array 396 and contact 394, the RF output terminal 338 is electrically coupled to phase shift element 372, which is located in the first-path output network zone 304. According to an embodiment, phase shift element 372 is implemented with a lambda/4 ($\lambda$/4) transmission line 373 (e.g., a microstrip line) that extends between contact 394 and a summing node 382. The transmission line 373 may impart about a 90 degree relative phase shift to the amplified first RF signal. For example, the phase shift element 372 may be formed from a portion of one or more of the metal layers of the substrate (e.g., one or both of layers 413 and/or 414).

Moving back to the power splitter 320 in the input signal zone 301, the second RF signal produced at output terminal 326 of the power splitter 320 and conveyed to conductive contact 392 is amplified through a peaking amplifier path, which includes a peaking amplifier die 352 (e.g., die 152, FIG. 1) mounted within the second-die mounting zone 303, and third and fourth phase shift elements 374, 376 (e.g., phase shift elements 174, 176, FIG. 1) within the second-path output network zone 305.

The illustrated embodiment of peaking amplifier die 352 also embodies a two-stage amplifier, which includes an RF input terminal 353, an input matching network 354, a driver transistor 355, an interstage matching network 356, an output transistor 357, and an RF output terminal 358. The signal path through the peaking amplifier die 352 is in a direction extending from the RF input terminal 353 to the RF output terminal 358, which direction is indicated by arrow 350. As can be seen in FIG. 3, the signal paths through the peaking and carrier amplifier die 352, 332 extend in significantly different directions, and more particularly the signal paths are orthogonal in the embodiment of FIG. 3.

According to an embodiment, the peaking amplifier die 352 is structurally identical to the carrier amplifier die 332, meaning that the two die 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and the RF output terminal 338, 358 is proximate to the second side of the die. The first sides of each die 332, 352 are oriented toward the input signal zone 301, and the first sides of the die 332, 352 are orthogonally arranged, with respect to each other, in an embodiment. Said another way, the structurally identical carrier and peaking amplifier die 332, 352 are coupled to the mounting surface 312 of the substrate 310 so that the die 332, 352 are orthogonal to each other, rendering the RF signal paths through the die 332, 352 also orthogonal to each other. Even though the die 332, 352 may be positioned relatively close together, their orthogonal orientations may significantly reduce coupling between signals carried through and amplified by the die 332, 352.

In any event, the amplified second RF signal is produced by the peaking amplifier die 352 at the RF output terminal 358. According to an embodiment, the RF output terminal 358 is electrically coupled to contact 395 at the mounting surface 312 with a second wirebond array 398. As illustrated in FIG. 3, the wirebonds of the wirebond array 398 are aligned in the same direction as the RF signal path through the peaking amplifier die 352 (e.g., in the direction indicated by arrow 350). In other words, the first and second wirebond arrays 396, 398 also are orthogonally arranged, with respect to each other, in an embodiment. Accordingly, even though the wirebond arrays 396, 398 also may be positioned relatively close together, their orthogonal orientations may significantly reduce coupling of RF signals carried through the wirebond arrays 396, 398. As can be seen in FIG. 3, it is apparent that the orthogonal orientation of die 332, 352 does increase the distance between the second sides of the die 332, 352, and thus increases the distance between wirebond arrays 396, 398, when compared with a distance that would be achieved if the die 332, 352 were arranged side-by-side as in a conventional arrangement. More specifically, the distance between wirebond arrays 396, 398 is greater than the length of the third side of die 332. In addition, in the illustrated layout, a portion of the second-path output network zone 305 is positioned between the wirebond arrays 396, 398.

Continuing along the peaking amplifier path, the RF output terminal 358 is electrically coupled through wirebond array 398 and contact 395 with the third and fourth phase shift elements 374, 376, which are located in the second-path output network zone 305. According to an embodiment, phase shift elements 374, 376 are implemented with two, series-coupled lambda/4 (λ/4) transformation/phasing networks 375, 377 that extend between contact 395 and summing node 382), where each of the transformation/phasing networks 375, 377 imparts about a 90 degree relative phase shift to the amplified second RF signal, in an embodiment. For example, the phase shift elements 374, 376 may be formed from portions of one or more of the metal layers of the substrate (e.g., one or both of layers 413 and/or 414).

As discussed above, the amplified first and second RF signals are conveyed through the phase shift elements 372, 374, 376 to summing node 382, where the RF signals combine substantially in phase. Summing node 382 is located in the output signal combiner zone 306, and is electrically connected to an output impedance matching network 384. The output impedance matching network 384 functions to present the proper load impedances to each of carrier and peaking amplifier dies 332, 352. Although the detail is not shown in FIG. 3, the output impedance matching network 384 may include various discrete and/or integrated components (e.g., capacitors, inductors, and/or resistors) to provide the desired impedance matching. The output impedance matching network 384 is electrically coupled through the substrate 310 to conductive landing pad 319 exposed at the land surface 314. The landing pad 319 functions as the RF output node (e.g., RF output node 114, FIG. 1) for the module 300.

Although not illustrated in FIG. 3, module 300 also includes bias circuitry configured to provide gate and drain bias voltages to some or all of the driver and output transistors 335, 355, 337, 357. For example, the bias circuitry may include, among other things, a plurality of landing pads (at the land surface 314 of the substrate 310), contacts (at the mounting surface 312 of the substrate 310), and other conductive structures and circuitry. Bias voltages provided to the gates and/or drains of the transistors 335, 355, 337, 357 facilitate Doherty operation of the module. For example, the transistors 335, 337 of the carrier amplifier die 332 may be biased to operate in class AB mode, and the transistors 355, 357 of the peaking amplifier die 352 may be biased to operate in class C mode.

Figure 4:
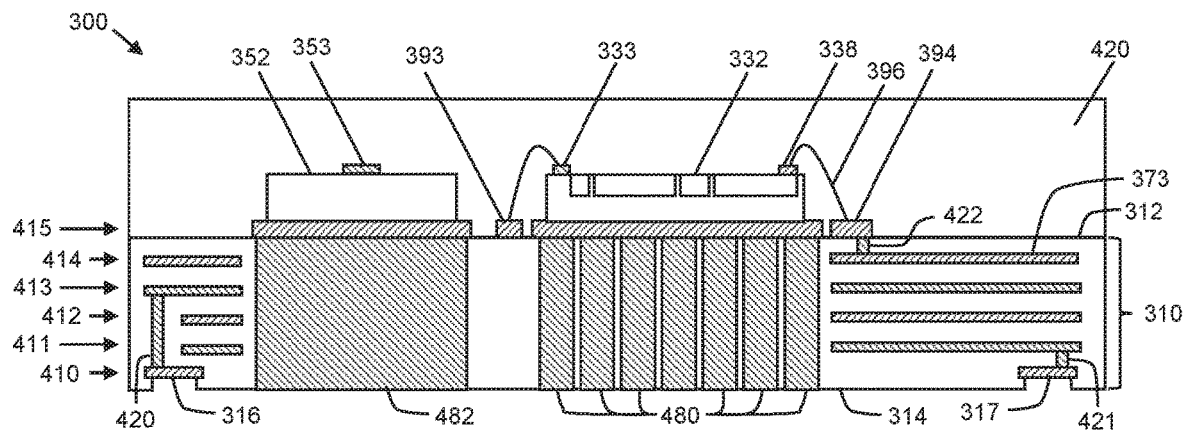
FIG. 4 is a cross-sectional, side view of the module of FIG. 3 along line 4-4.

According to an embodiment, all of the components mounted to the mounting surface 312 of the substrate 310 are encapsulated with non-conductive encapsulation material 420 (FIG. 4). In an alternate embodiment, the components could be contained within an air cavity, which is defined by various structures (not illustrated) overlying the mounting surface 312.

The carrier and peaking amplifier die 332, 352 may be implemented using various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Further, each of the transistors 335, 337, 355, 357 of the carrier and peaking amplifier die 332, 352 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, each of the transistors 335, 337, 355, 357 may be a bipolar junction transistor (BJT). References herein to a "gate," "drain," and "source," which are commonly used to describe FETs, are not intended to be limiting, as each of these designations has analogous features for a BJT implementation (e.g., a base, collector, and emitter, respectively).

Various modifications may be made to module 300 without departing from the scope of the inventive subject matter. For example, although substrate 310 is depicted, in FIG. 4, to include five metal layers 410-414, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips.

Further still, the carrier and peaking amplifier die 332, 352 and/or the first and second wirebond arrays 396, 398 may be arranged in non-orthogonal manners, so long as there is a significant angular separation (e.g., an angular separation of 45 degrees or more) between their respective orientations. In addition, the carrier and peaking amplifier die 332, 352 may include single stage amplifiers, or two distinct amplifier die (one driver amplifier die and one output amplifier die) may be implemented along each path 330, 350). In still another embodiment, the carrier die 332 and peaking die 352 may be switched, so that 90 degree phase shifts are imparted to the first RF signal both prior to and after amplification by the carrier die 332, and so that a 180 degree phase shift is imparted to the second RF signal after amplification by the peaking die 352. "Switching" of the carrier and peaking die 332, 352 may be achieved by altering the bias provided to each die 332, 352 so that die 332 is operated in class C mode, and die 352 is operated in class AB mode. In addition to the above, module 300 also may include various discrete and/or integrated components (e.g., capacitors, inductors, and/or resistors) electrically coupled to phase shift elements 372, 374, 376 to provide desired impedance transformations.

Figure 5:
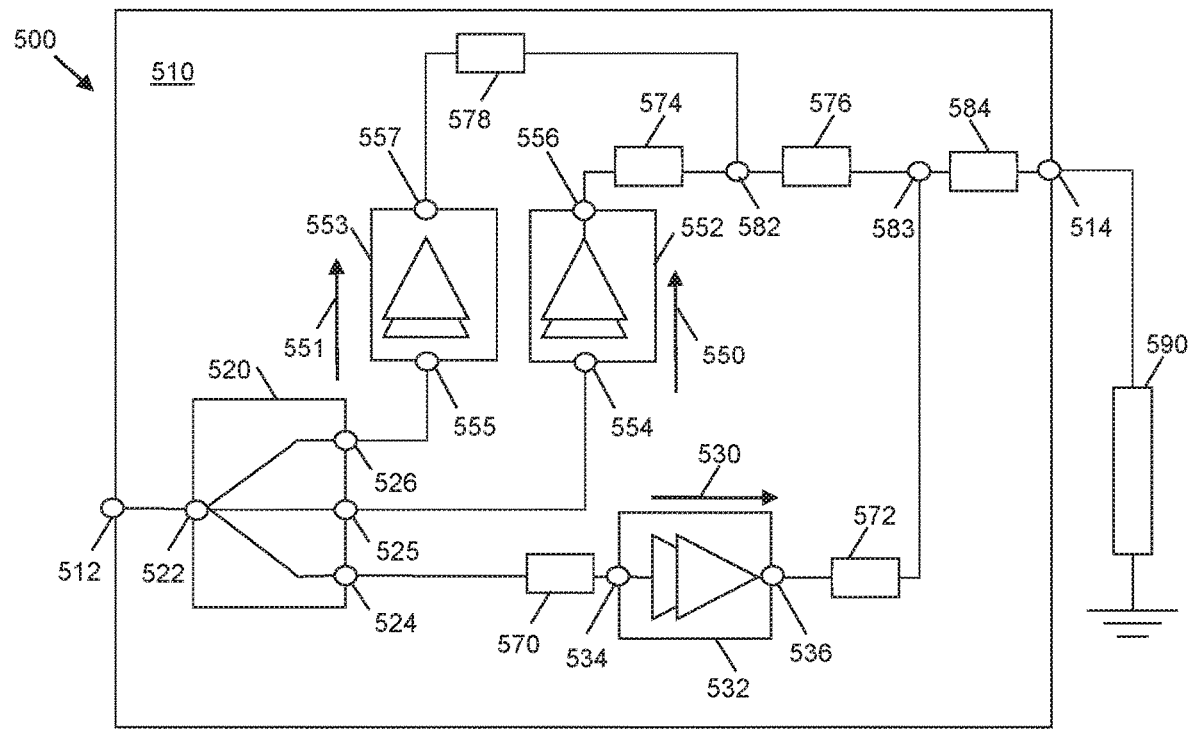
FIG. 5 is a schematic view of a three-way Doherty amplifier, in accordance with an example embodiment.

The above described embodiments include two-way Doherty power amplifier implementations, which include a carrier amplifier and one peaking amplifier. According to other embodiments, a Doherty power amplifier may include more than one peaking amplifier. For example, FIG. 5 is a schematic view of a three-way Doherty amplifier 500, in accordance with an example embodiment. The Doherty amplifier 500 of FIG. 5 is similar to the Doherty amplifier 100 of FIG. 1, except for the inclusion of two peaking amplifiers, rather than one.

More specifically, Doherty amplifier 500 includes an RF input node 512, an RF output node 514, a power splitter 520, a carrier amplifier path 530, a first peaking amplifier path 550, a second peaking amplifier path 551, and two combiner nodes 582, 583, in an embodiment. When incorporated into a larger RF system, the RF input node 512 is coupled to an RF signal source (not illustrated), and the RF output node 514 is coupled to a load 590 (e.g., an antenna or other load). Fundamentally, the Doherty amplifier 500 is configured to amplify the input RF signal, and to produce an amplified RF signal at the RF output node 514. As indicated in FIG. 5 with box 510, some or all components of Doherty amplifier 500 may be implemented in a single device package or module.

The power splitter 520 has an input 522 and three outputs 524, 525, 526, in an embodiment. The power splitter input 522 is coupled to the RF input node 512 to receive the input RF signal. The power splitter 520 is configured to divide the RF input signal received at input 522 into first, second, and third RF signals, which are provided to the carrier and peaking amplifier paths 530, 550, 551 through outputs 524-526. In addition, the power splitter 520 may include a first phase shift element that is configured to impart about a 90 degree phase shift to the signal provided at output 524.

When Doherty amplifier 500 has a symmetrical configuration (i.e., a configuration in which the carrier and peaking amplifier power transistors are substantially identical in size), the power splitter 520 may divide or split the input RF signal received at the input 522 into three signals that have equal or unequal power, depending on whether the Doherty power amplifier is symmetrical or asymmetrical. In some embodiments, the power splitter 520 may be implemented with fixed-value, passive components. In other embodiments, the power splitter 520 may be implemented with one or more controllable variable attenuators and/or variable phase shifters, which enable the power splitter 520 to attenuate and/or phase shift the first, second, and third RF signals based on externally-provided control signals.

The outputs 524-526 of the power splitter 520 are connected to the carrier and peaking amplifier paths 530, 550, 551, respectively. The first and second peaking amplifier paths 550, 551 are configured to amplify the second and third RF signals, respectively, and to provide the amplified second and third RF signals to a first summing node 582, where the signals are summed in phase to create a first combined signal. In addition, the carrier amplifier path 530 is configured to amplify the first RF signal from the power splitter 520, and to provide the amplified first RF signal to a second summing node 583, where it is summed in phase with the first combined signal. The paths 530, 550, 551 include various impedance matching elements 570 and phase shift elements 572, 574, 576, 578, (e.g., 90 degree phase shift elements) so that the amplified second and third RF signals arrive in phase with each other at the summing node 582, and so that the first combined signal produced at summing node 582 arrives in phase with the amplified first RF signal at summing node 583. Although a particular configuration of phase shift elements is shown in FIG. 5, the phase shift elements may be differently arranged, in other embodiments.

Along the carrier amplifier path 530, a carrier amplifier die 532 includes an RF input terminal 534, an RF output terminal 536, and one or more amplification stages coupled between the input and output terminals 534, 536. Along the first peaking amplifier path 550, a first peaking amplifier die 552 includes an RF input terminal 554, an RF output terminal 556, and one or more amplification stages coupled between the input and output terminals 554, 556. Similarly, along the second peaking amplifier path 551, a second peaking amplifier die 553 includes an RF input terminal 555, an RF output terminal 557, and one or more amplification stages coupled between the input and output terminals 555, 557.

An output impedance matching network 584 functions to present the proper load impedances to each of carrier and peaking amplifier dies 532, 552, 553. The resulting amplified RF output signal is produced at RF output node 514, to which an output load 590 (e.g., an antenna) is connected.

Amplifier 500 is configured so that the carrier amplifier path 530 provides amplification for relatively low level input signals. As the magnitude of the input signal increases, a first input power level is reached at which the first peaking amplification path 550 also becomes active. Finally, as the magnitude of the input signal increases even further, a second input power level is reached at which the second peaking amplification path 551 also becomes active. This may be accomplished, for example, by biasing the carrier amplifier die 532, such that the carrier amplifier die 532 operates in a class AB mode, and biasing the peaking amplifier die 552, 553 such that the peaking amplifier die 552, 553 operate at different class C bias points.

According to an embodiment, the physical components of the carrier and peaking amplification paths 530, 550, 551 are oriented, with respect to each other, so that portions of the carrier path 530 extend in directions that are substantially different from corresponding portions of the peaking amplifier paths 550, 551. For example, a portion of a first signal path through the carrier amplifier die 532 extends in a first direction (indicated by arrow 530) between the RF input and output terminals 534, 536. Similarly, portions of second and third signal paths through the peaking amplifier die 552, 553 extend in a second direction (indicated by arrows 550, 551) between the RF input and output terminals 554, 556 and 555, 557, where the first and second directions are substantially different from each other. In the illustrated embodiment, the first and second directions are orthogonal to each other (i.e., angularly separated by 90 degrees). In other embodiments, the first and second directions may be angularly separated by less or more than 90 degrees According to an embodiment, the angular separation between directions of the portions of the first and second signal paths that traverse the carrier and peaking amplifier die 532, 534, 535 is achieved by orienting the carrier and peaking amplifier die 532, 534, 535 so that the signal path between the RF input and output terminals 534, 536 of the carrier amplifier die is angularly separated from the signal paths between the RF input and output terminals 554, 556, 555, 557 of the peaking amplifier die 534, 535. For example, the carrier die 532 is oriented orthogonally to the peaking amplifier die 534, 535, in an embodiment, so that the direction of the portion of the signal path through the carrier amplifier die 532 is orthogonal to the direction of the portions of the signal paths through the peaking amplifier die 534, 535.

Figure 6:
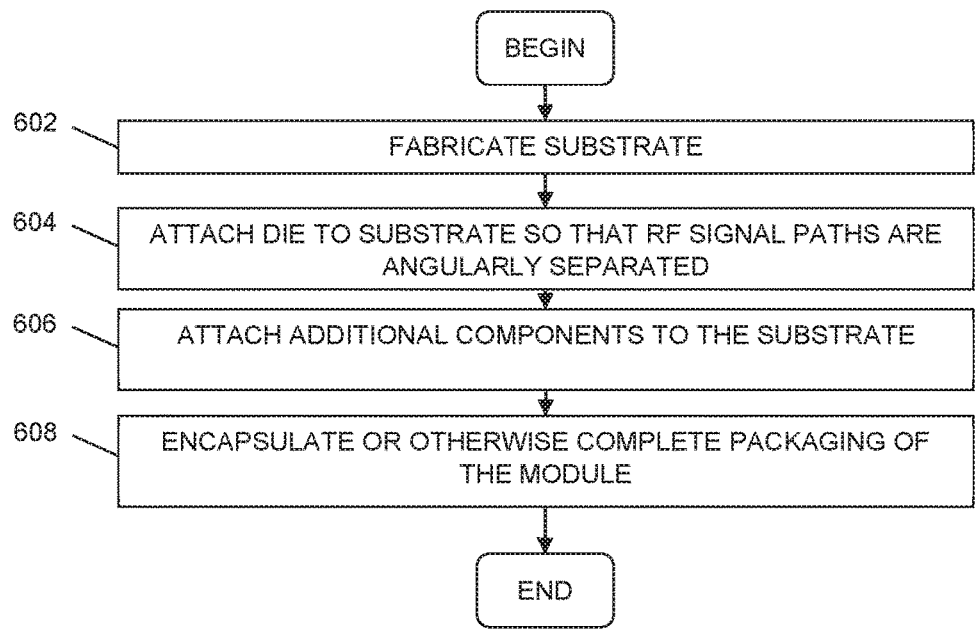
FIG. 6 is a flowchart of a method for fabricating a Doherty amplifier module, in accordance with an example embodiment.

FIG. 6 is a flowchart of a method for fabricating a Doherty amplifier module (e.g., Doherty amplifier module 300, FIG. 3), in accordance with an example embodiment. The method begins, in block 602, by fabricating a substrate (e.g., substrate 310, FIG. 3), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 301-306, FIG. 3) may be defined at the mounting surface (e.g., surface 312, FIG. 3) of the substrate. Within die mounting zones (e.g., zones 302, 303, FIG. 3), the substrate may include conductive heat-sink features (e.g., conductive trenches 380, 382, FIG. 3). In addition, in an embodiment, the substrate may include one or more transmission lines (e.g., transmission lines 373, 375, 377, FIG. 3), which are configured to impart desired phase shifts to signals traveling through the transmission lines.

In block 604, first and second amplifier die (e.g., carrier and peaking amplifier die 332, 352, FIG. 3) are attached to the mounting surface of the substrate in the die mounting zones. As discussed previously, the first and second amplifier die are attached so that RF signal paths through the die are oriented in substantially different directions (or angularly separated). For example, the first and second amplifier die may be attached to the substrate so that the die, and the RF signal paths through the die, are substantially orthogonal to each other.

In block 606, additional discrete components are attached to the mounting surface of the substrate, and the various components are electrically connected together with wirebonds (e.g., including wirebonds 396, 398, FIG. 3) and/or other conductive coupling means. Finally, in block 608, the various die and components overlying the mounting surface of the substrate are encapsulated (e.g., with encapsulant material 420, FIG. 4), or otherwise contained (e.g., in an air cavity package configuration) to complete the module.

An embodiment of a Doherty amplifier module includes a substrate, an RF signal splitter, a carrier amplifier die, and a peaking amplifier die. The substrate has a mounting surface, and a plurality of non-overlapping zones are defined at the mounting surface, including an input signal zone, a first-die mounting zone, and a second-die mounting zone. The RF signal splitter is in the input signal zone, and the RF signal splitter is configured to receive and divide an input RF signal into a first input RF signal and a second input RF signal, and to convey the first and second input RF signals to first and second splitter output terminals. The carrier amplifier die is in the first-die mounting zone, and the carrier amplifier die includes one or more first power transistors configured to amplify, along a carrier signal path, the first input RF signal to produce an amplified first RF signal. The peaking amplifier die is in the second-die mounting zone, and the peaking amplifier die includes one or more second power transistors configured to amplify, along a peaking signal path, the second input RF signal to produce an amplified second RF signal. The carrier amplifier die and the peaking amplifier die are coupled to the substrate so that the carrier and peaking signal paths through the carrier amplifier die and the peaking amplifier die extend in substantially different directions.

An embodiment of a power amplifier includes a substrate, a first amplifier die, and a second amplifier die. The substrate has a mounting surface, and a plurality of conductive contacts exposed at the mounting surface. The plurality of conductive contacts includes a first-die input contact, a second-die input contact, a first-die output contact, and a second-die output contact. The first and second amplifier die are coupled to the mounting surface. The first amplifier die includes one or more first power transistors, a first-die input terminal electrically coupled to the first-die input contact and to a control terminal of the one or more first power transistors, and a first-die output terminal electrically coupled to the first-die output contact and to a current-carrying terminal of the one or more first power transistors. The first amplifier die is configured to amplify a first input RF signal received through the first-die input terminal, and to convey an amplified first RF signal to the first-die output terminal. A first signal path through the first amplifier die extends in a first direction from the first die-input terminal to the first-die output terminal. The second amplifier die includes one or more second power transistors, a second-die input terminal electrically coupled to the second-die input contact and to a control terminal of the one or more second power transistors, and a second-die output terminal electrically coupled to the second-die output contact and to a current-carrying terminal of the one or more second power transistors. The second amplifier die is configured to amplify a second input RF signal received through the second-die input terminal, and to convey an amplified second RF signal to the second-die output terminal. A second signal path through the second amplifier die extends in a second direction from the second die-input terminal to the second-die output terminal, and the second direction is substantially different from the first direction.

A method of fabricating an amplifier module includes attaching a first amplifier die to a mounting surface of a substrate in a first die mounting zone, where a first signal path through the first amplifier die extends in a first direction, and attaching a second amplifier die to the mounting surface of the substrate in a second die mounting zone, where a second signal path through the second amplifier die extends in a second direction that is substantially different from the first direction. The method further includes electrically coupling an input of the first amplifier die to a first output of a signal splitter, and electrically coupling an input of the second amplifier die to a second output of the signal splitter.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier module comprising:
   a substrate with a mounting surface, wherein a plurality of non-overlapping zones is defined at the mounting surface, including a first-die mounting zone and a second-die mounting zone;
   a first amplifier die in the first-die mounting zone, wherein the first amplifier die includes one or more first power transistors configured to amplify, along a first signal path, a first input RF signal to produce an amplified first RF signal at a first RF output terminal;
   a second amplifier die in the second-die mounting zone, wherein the second amplifier die includes one or more second power transistors configured to amplify, along a second signal path, a second input RF signal to produce an amplified second RF signal at a second RF output terminal, wherein the first amplifier die and the second amplifier die are coupled to the substrate so that the first and second signal paths through the first amplifier die and the second amplifier die extend in substantially different directions; and
   a summing node electrically coupled to the first and second RF output terminals, wherein the summing node is configured to receive and combine the amplified first and second RF signals.

2. The module of claim 1, further comprising:
   a first wirebond array coupled between the first RF output terminal of the first amplifier die and the substrate, wherein the first wirebond array is configured to convey the amplified first RF signal; and
   a second wirebond array coupled between the second RF output terminal of the second amplifier die and the substrate, wherein the second wirebond array is configured to convey the amplified second RF signal, and wherein the first and second wirebond arrays are oriented in substantially different directions from each other.

3. The module of claim 1, wherein the first and second amplifier die are arranged orthogonally to each other.

4. The module of claim 1, further comprising:
   a third amplifier die that includes one or more third power transistors configured to amplify, along a third signal path, a third input RF signal provided by the RF signal splitter to produce an amplified third RF signal, wherein the first amplifier die and the third amplifier die are coupled to the substrate so that the first and third signal paths through the first amplifier die and the third amplifier die extend in substantially different directions.

5. The module of claim 1, wherein the plurality of non-overlapping zones further includes an input signal zone, and wherein the module further comprises:
   an RF signal splitter in the input signal zone, wherein the RF signal splitter is configured to receive and divide an input RF signal into the first input RF signal and the second input RF signal, and to convey the first and second input RF signals to first and second splitter output terminals that are electrically coupled to the first and second amplifier die.

6. The module of claim 5, wherein the RF signal splitter comprises:
   a power divider configured to divide the power of the input RF signal into the first input RF signal and the second input RF signal;
   a first phase shifter and a first attenuator series coupled between a first power divider output and the first splitter output terminal; and
   a second phase shifter and a second attenuator series coupled between a second power divider output and the second splitter output terminal.

7. The module of claim 1, further comprising:
   a plurality of conductive contacts exposed at the mounting surface of the substrate, wherein the plurality of conductive contacts includes a first-die input contact, a second-die input contact, a first-die output contact, and a second-die output contact,
   wherein the first amplifier die is coupled to the mounting surface, and the first amplifier die includes:
      a first-die input terminal electrically coupled to the first-die input contact and to a control terminal of the one or more first power transistors, and the first RF output terminal electrically coupled to the first-die output contact and to a current-carrying terminal of the one or more first power transistors, wherein the first amplifier die is configured to amplify the first input RF signal received through the first-die input terminal, and to convey the amplified first RF signal to the first RF output terminal, and wherein the first signal path through the first amplifier die extends in a first direction from the first die-input terminal to the first RF output terminal, and wherein the second amplifier die is coupled to the mounting surface, and the second amplifier die includes:

a second-die input terminal electrically coupled to the second-die input contact and to a control terminal of the one or more second power transistors, and the second RF output terminal electrically coupled to the second-die output contact and to a current-carrying terminal of the one or more second power transistors, wherein the second amplifier die is configured to amplify the second input RF signal received through the second-die input terminal, and to convey the amplified second RF signal to the second RF output terminal, and wherein the second signal path through the second amplifier die extends in a second direction from the second die-input terminal to the second RF output terminal, and wherein the first direction and the second direction are the substantially different directions.

8. The module of claim 7, wherein:

the plurality of non-overlapping zones further includes an input signal zone;

the first transistor die is mounted over the first-die mounting zone, and the first transistor die is rectangular with parallel first and second sides, and parallel third and fourth sides extending between the first and second sides, wherein the first-die input terminal is proximate to the first side, the first-die output terminal is proximate to the second side, and the first side is oriented toward the input signal zone; and the second transistor die is mounted over the second-die mounting zone, and the second transistor die is rectangular with parallel fifth and sixth sides, and parallel seventh and eighth sides extending between the fifth and sixth sides, wherein the second-die input terminal is proximate to the fifth side, the second-die output terminal is proximate to the sixth side, and the fifth side is oriented toward the input signal zone.

9. The module of claim 8, wherein:

the plurality of conductive contacts further includes an input RF signal contact in the input signal zone;

the module further comprises an RF signal splitter in the input signal zone, wherein the RF signal splitter includes a splitter input terminal coupled to the input RF signal contact, a first splitter output terminal coupled to the first-die input contact, and a second splitter output terminal coupled to the second-die input contact; and the RF signal splitter is configured to receive an input RF signal through the splitter input terminal, and to divide a power of the input RF signal into the first input RF signal and the second input RF signal, and to convey the first and second input RF signals to the first and second splitter output terminals.

10. The module of claim 9, wherein the RF signal splitter comprises:

a power divider configured to divide the power of the input RF signal into the first input RF signal and the second input RF signal;

a first phase shifter and a first attenuator series coupled between a first power divider output and the first splitter output terminal; and a second phase shifter and a second attenuator series coupled between a second power divider output and the second splitter output terminal.

11. The module of claim 10, wherein the power divider comprises a first phase shift element, wherein the first phase shift element is configured to apply a first phase shift to the first RF signal so that the first and second input RF signals are substantially 90 degrees out of phase with each other at the first-die and second-die input contacts.

12. The module of claim 7, further comprising:

a first wirebond array electrically coupling the first RF output terminal to the first-die output contact, wherein wirebonds in the first wirebond array extend along the first direction; and a second wirebond array electrically coupling the second RF output terminal to the second-die output contact, wherein wirebonds in the second wirebond array extend along the second direction.

13. The module of claim 1, wherein:

the first and second amplifier die are flip-chip mounted to the substrate.

14. The module of claim 1, wherein the substantially different directions are angularly separated by at least 45 degrees.

15. The module of claim 14, wherein the substantially different directions are substantially orthogonal to each other.

16. The module of claim 1, wherein:

the plurality of non-overlapping zones further includes an output network zone;

the module further comprises one or more first phase shift elements in the output network zone;

the one or more first phase shift elements are electrically coupled to the first amplifier die, and are configured to apply a first phase shift to the amplified first RF signal.

17. The module of claim 16, wherein the first phase shift is substantially 90 degrees.

18. The module of claim 16, wherein:

the plurality of non-overlapping zones further includes an output signal combiner zone;

the substrate further includes the summing node coupled to the one or more first phase shift elements and to the second amplifier; and the summing node is configured to combine the amplified first and second RF signals after application of the first phase shift to the amplified first RF signal.

19. A method of fabricating an amplifier module, the method comprising the steps of:

attaching a first amplifier die to a mounting surface of a substrate in a first die mounting zone, wherein a first signal path through the first amplifier die extends in a first direction, and the first amplifier is configured to produce an amplified first RF signal;

attaching a second amplifier die to the mounting surface of the substrate in a second die mounting zone, wherein a second signal path through the second amplifier die extends in a second direction that is substantially different from the first direction, and the second amplifier is configured to produce an amplified second RF signal; and electrically coupling an output of the first amplifier die to an output of the second amplifier die at a summing node that is configured to receive and combine the amplified first and second RF signals.

20. The method of claim 19, wherein the first and second amplifier die are attached to the substrate so that the first and second directions are orthogonal to each other.

21. The module of claim 1, further comprising:
a transmission line on the substrate, which electrically couples the first RF output terminal to the summing node.

22. The module of claim 21, further comprising:
a first wirebond array coupled between the first RF output terminal and the transmission line, wherein a phase shift of 90 degrees is imparted on the amplified first RF signal between the first RF output terminal and the summing node.

\* \* \* \* \*